United States Patent
Amano et al.

(10) Patent No.: US 9,536,761 B2
(45) Date of Patent: Jan. 3, 2017

(54) SUBSTRATE LIQUID PROCESSING APPARATUS

(71) Applicant: Tokyo Electron Limited, Tokyo (JP)

(72) Inventors: Yoshifumi Amano, Koshi (JP); Yuki Ito, Koshi (JP); Eiichiro Okamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/840,237

(22) Filed: Aug. 31, 2015

(65) Prior Publication Data

US 2016/0064256 A1 Mar. 3, 2016

(30) Foreign Application Priority Data

Sep. 2, 2014 (JP) ................................ 2014-178444

(51) Int. Cl.
*H01L 21/67* (2006.01)

(52) U.S. Cl.
CPC ................................ *H01L 21/6715* (2013.01)

(58) Field of Classification Search
CPC .......... H01L 21/67051; H01L 21/6715; H01L 21/6708; G03F 7/162; B05C 11/08
USPC .................. 134/33, 902, 153, 157, 26, 94.1, 95.2, 134/104.2, 18, 198, 56 R; 118/52, 320, 319, 500, 118/728, 50, 58, 725, 501; 427/240, 425, 346, 427/421.1, 294
See application file for complete search history.

(56) References Cited

U.S. PATENT DOCUMENTS

| 2002/0006876 A1* | 1/2002 | Hongo | B24B 37/345 |
| | | | 156/345.12 |
| 2008/0173333 A1* | 7/2008 | Nanba | H01L 21/67051 |
| | | | 134/30 |
| 2012/0064256 A1* | 3/2012 | Higashijima | H01L 21/02087 |
| | | | 427/532 |

FOREIGN PATENT DOCUMENTS

JP 2014-086639 A 5/2014

* cited by examiner

*Primary Examiner* — David Cormier
*Assistant Examiner* — Thomas Bucci
(74) *Attorney, Agent, or Firm* — Pearne & Gordon LLP (57) ABSTRACT

A substrate liquid processing apparatus includes a cup 50 configured to receive a processing liquid supplied onto a substrate. The cup includes a ring-shaped first exhaust space 530 in contact with a top opening 50A, and a ring-shaped second exhaust space 540 which is in contact with an exhaust port 52 and is disposed adjacent to the first exhaust space, and the first exhaust space and the second exhaust space communicate with each other intermittently or continuously along an entire circumference thereof. Further, the cup has an inner wall that confines an inner periphery of the second exhaust space, and the inner wall includes a first wall portion 581 serving as an upper part of the inner wall, and a second wall portion which serves as a lower part of the inner wall and is located at an inner position than the first wall portion in a radial direction.

11 Claims, 5 Drawing Sheets

SUBSTRATE LIQUID PROCESSING APPARATUS

CROSS-REFERENCE TO RELATED APPLICATION

This application claims the benefit of Japanese Patent Application No. 2014-178444 filed on Sep. 2, 2014, the entire disclosures of which are incorporated herein by reference.

TECHNICAL FIELD

The embodiments described herein pertain generally to a technique of gas exhaust in a substrate liquid processing apparatus.

BACKGROUND

In the course of manufacturing a semiconductor device, various liquid processes, such as a wet etching process, a chemical liquid cleaning process, etc., are performed on a substrate such as a semiconductor wafer. A single-wafer processing unit for performing these liquid processes includes a spin chuck that rotates the substrate around a vertical axis line while holding the substrate horizontally; a nozzle through which a processing liquid is supplied onto the substrate being rotated; and a cup that receives and collects the processing liquid dispersed from the substrate after supplied thereto.

The cup has a top opening at a central upper end thereof and an exhaust port at a bottom portion thereof. The top opening of the cup has a diameter slightly larger than that of the substrate. If the inside of the cup is suctioned through the exhaust port, a gas (typically, clean air) that exists in a space above the substrate is drawn into the inside of the cup through the top opening and exhausted through the exhaust port. The cup is provided with a wall for guiding a flow of the gas within the cup (see, for example, Patent Document 1). By allowing the gas to flow within the cup at an appropriate flow rate in a proper direction, the processing liquid once dispersed from the substrate can be suppressed from re-adhering to the substrate, and mist of the processing liquid can be removed from the gas.

It has been required to perform the exhaust effectively even with a low suction force from the exhaust port. In this regard, there still is a room for improvement in the wall structure described in Patent Document 1.

Patent Document 1: Japanese Patent Laid-open Publication No. 2014-086639

SUMMARY

In view of the foregoing, exemplary embodiments provide a substrate liquid processing apparatus capable of performing an exhaust effectively even with a low suction force from an exhaust port.

In one exemplary embodiment, a substrate liquid processing apparatus includes a holding unit configured to hold a substrate horizontally; a driving unit configured to rotate the holding unit around a vertical axis; a nozzle configured to supply a processing liquid onto the substrate which is rotated while being held by the holding unit; and a cup configured to receive the processing liquid supplied onto the substrate. Here, the cup includes a top opening at a central top end portion thereof and an exhaust port through which an inside of the cup is exhausted. Further, the cup further includes a ring-shaped first exhaust space in contact with the top opening, and a ring-shaped second exhaust space which is in contact with the exhaust port and is disposed adjacent to the first exhaust space. Moreover, the first exhaust space and the second exhaust space communicate with each other intermittently or continuously along an entire circumference thereof, and the first exhaust space has a ring-shaped liquid reservoir configured to receive the processing liquid supplied onto the substrate. Furthermore, a ring-shaped guide wall, which is configured to separate the first exhaust space from the second exhaust space and guide the processing liquid supplied onto the substrate toward the liquid reservoir, is provided, and a ring-shaped isolation wall, which is configured to separate the first exhaust space from the second exhaust space and suppress the processing liquid received in the liquid reservoir from being introduced into the second exhaust space, is provided.

Further, in the substrate liquid processing apparatus, an inner wall configured to confine an inner periphery of the second exhaust space includes a first wall portion serving as an upper part of the inner wall, and a second wall portion which serves as a lower part of the inner wall and is located at an inner position than the first wall portion in a radial direction.

According to the exemplary embodiments, by reducing the resistance against the gas flow path within the cup, it is possible to perform the exhaust effectively even with a low suction force from the exhaust port.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings.

Figure 1:
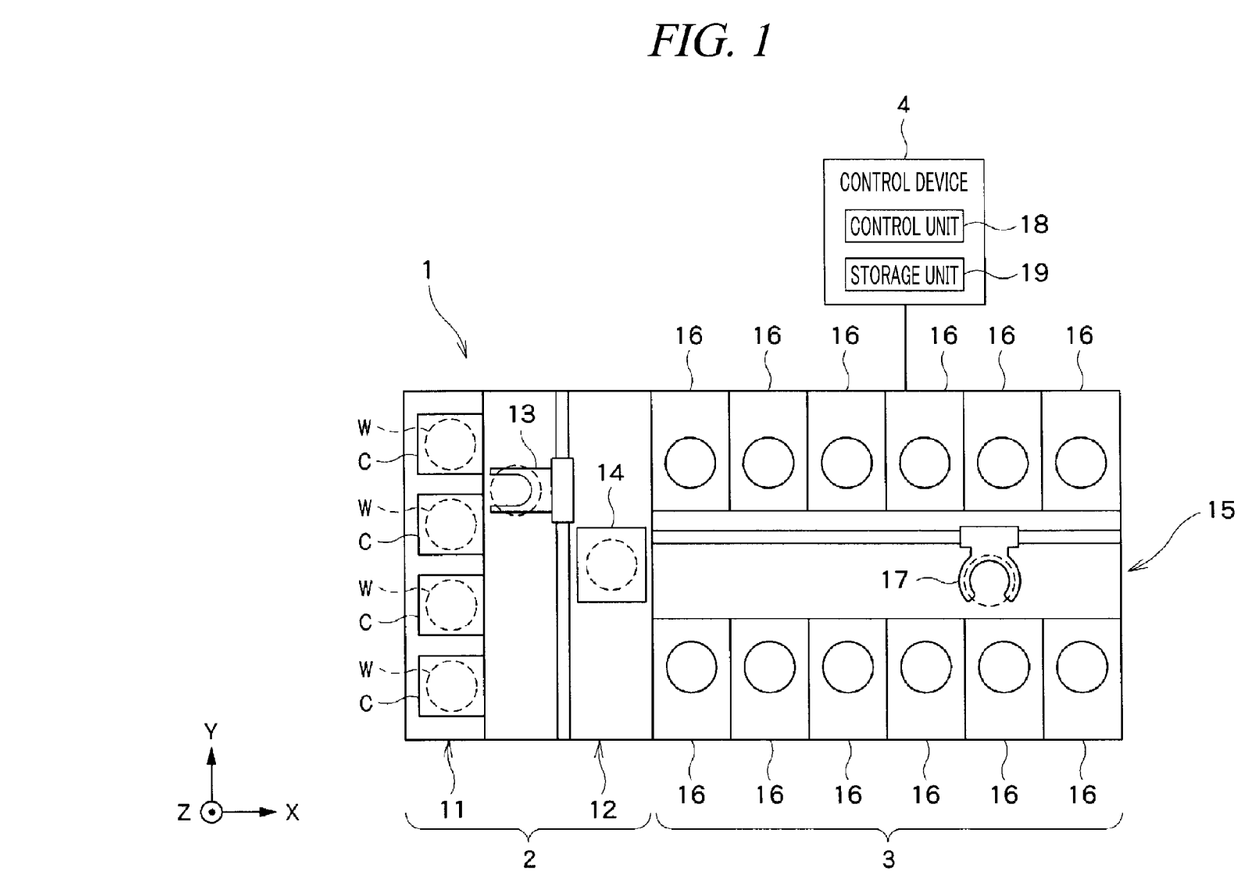
FIG. 1 is a plan view illustrating an outline of a substrate processing system provided with a processing unit according to an exemplary embodiment of the present disclosure.

FIG. 1 is a plan view illustrating an outline of a substrate processing system according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of wafers horizontally.

The transfer section 12 is provided adjacent to the carrier placing section 11, and provided with a substrate transfer device 13 and a delivery unit 14. The substrate transfer device 13 is provided with a substrate holding mechanism configured to hold the wafer W. Further, the substrate transfer device 13 is movable horizontally and vertically and pivotable around a vertical axis, and transfers the wafers W between the carriers C and the delivery unit 14 by using the substrate holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a substrate holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the substrate holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
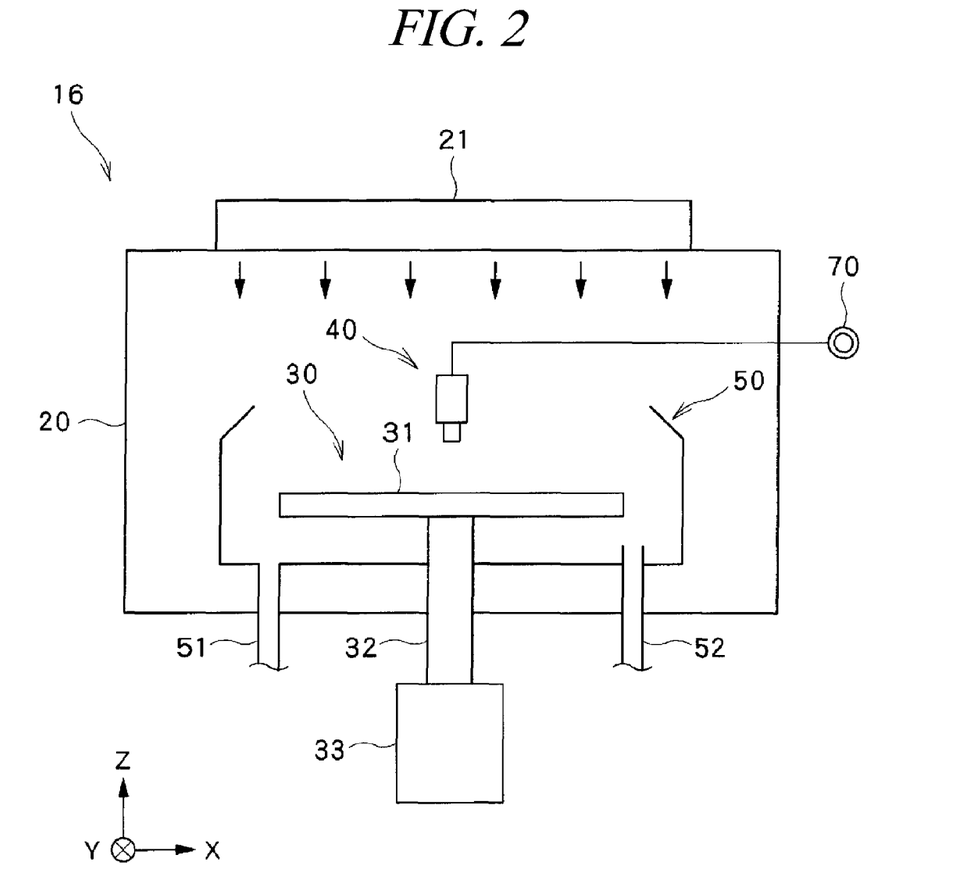
FIG. 2 is a diagram illustrating the outline of the processing unit shown in FIG. 1.

Now, an outline of the processing unit 16 will be elaborated with reference to FIG. 2. FIG. 2 is a diagram illustrating the outline of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

Figure 3:
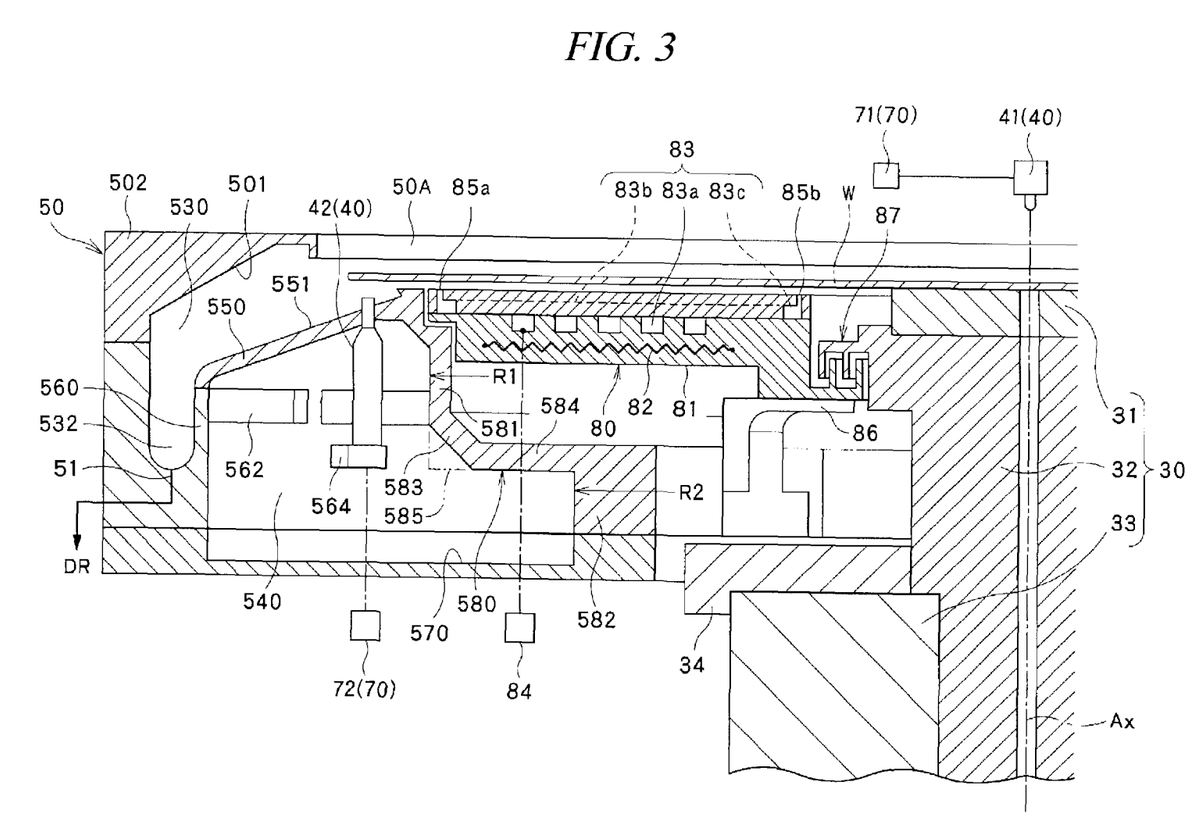
FIG. 3 is a cross sectional view illustrating major parts of the processing unit, which is obtained by cutting the processing unit along a vertical plane that passes through a central axis of a holding unit and does not pass through an exhaust port.
Figure 4:
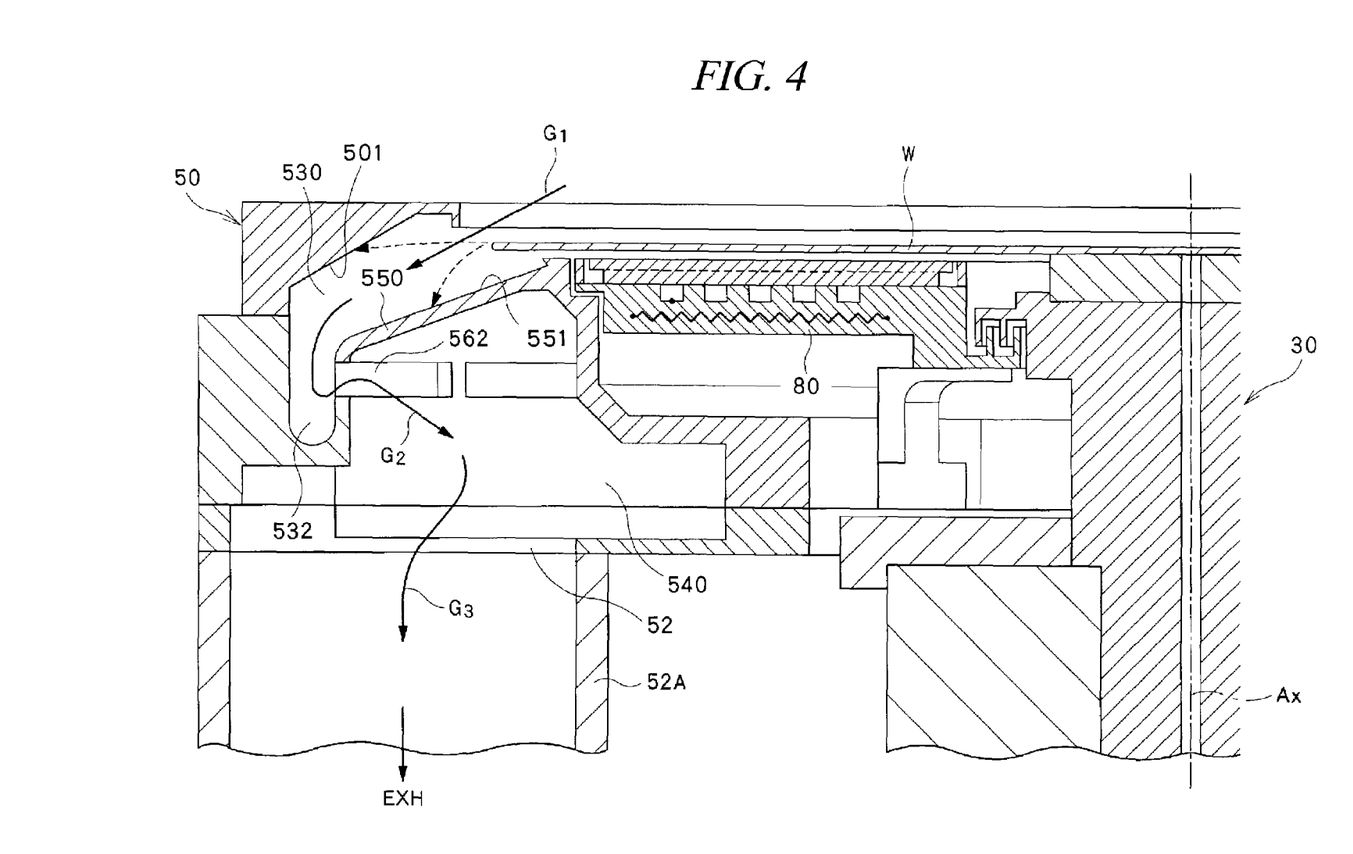
FIG. 4 is a cross sectional view illustrating major parts of the processing unit, which is obtained by cutting the processing unit along a vertical plane that passes through the central axis of the holding unit and a central axis of the exhaust port.

Hereinafter, the recovery cup (hereinafter, simply referred to as "cup") 50 of the processing unit 16, the substrate holding mechanism 30 and components therearound will be elaborated with reference to FIG. 3 and FIG. 4. FIG. 3 is a cross sectional view for illustrating major components of the processing unit 16, which is obtained by cutting the processing unit 16 along a plane that passes through a central axis Ax of the holding unit 31 and does not pass through the exhaust port 52. FIG. 4 is a cross sectional view for illustrating major components of the substrate processing unit 16, which is obtained by cutting the processing unit 16 along a vertical plane that passes through a central axis of the exhaust port 52 and the central axis Ax of the holding unit 31. Most of the members shown in FIG. 3 and FIG. 4 are approximately rotationally symmetric with respect to the central axis Ax.

The holding unit 31 of the substrate holding mechanism 30 serves as a vacuum chuck and is configured to hold the wafer W horizontally by vacuum-attracting a central portion of a rear surface (i.e., a surface where no device is formed) of the wafer W. The driving unit 33 is implemented by an electric motor, and the support unit 32 is configured as a rotational shaft of the electric motor (driving unit 33). That is, in the shown exemplary embodiment, the vacuum chuck (holding unit 31) is directly connected with the rotational shaft (support unit 32) of the electric motor (driving unit 33). In FIG. 3 and FIG. 4, a reference numeral 34 denotes a flange of the electric motor.

As shown in FIG. 3 and FIG. 4, the processing fluid supply unit 40 schematically illustrated in FIG. 2 includes a first nozzle 41 configured to supply a processing liquid onto a front surface of the wafer W; and a second nozzle 42 configured to supply a processing liquid onto a periphery portion of the rear surface of the wafer W. Processing liquids (a chemical liquid, a rinse liquid, etc.) required for the processing are supplied from processing fluid supply mechanisms 71 and 72 into the nozzles 41 and 42, respectively. For example, the first nozzle 41 is held at a tip end portion of a rotary arm (not shown), and is placed at a position above a central portion of the wafer W while supplying the processing liquid onto the wafer W and located at a position outside the wafer W while not supplying the processing liquid onto the wafer W.

A heating unit 80 is provided around the holding unit 31 to heat the wafer W by discharging a temperature control gas toward the wafer W. The heating unit 80 includes a circular plate-shaped main body 81 surrounding the holding unit 31, and a heater 82 such as a resistance heater is embedded in the main body 81. A gas opening 83 is formed in the main body 81. An inert gas such as a nitrogen gas is supplied from a gas supply mechanism 84 into the gas opening 83 through a gas supply line shown in FIG. 3 by a dashed dotted line. The gas opening 83 includes portions 83a (irregularity portions extended in a circumferential direction to be adjacent to the heater 82); a portion 83b (a portion extended in a radial direction to connect the portions 83a with each other); and portions 83c (portions that are connected with both ends of the portion 83b). The inert gas is supplied into the portions 83a of the gas opening 83 and reaches the portions 83c after heated by heat from the heater 82 while passing through the portions 83a and 83b. Then, the inert gas is discharged toward the wafer W from a multiple number of discharge openings 85a and 85b that are formed in the circumferential direction at a regular interval therebetween.

The circular plate-shaped main body 81 is supported by a support 86 which is fixed to a bottom wall 570 of the cup 50. A labyrinth seal 87 is provided between an inner end portion of the circular plate-shaped main body 81 in a radial direction and an upper outer end portion of the support unit 32 in the radial direction. The labyrinth seal 87 is configured to suppress the temperature control gas discharged from the discharge openings 85a and 85b from being leaked through a gap between the main body 81, which is not rotated, and the support unit 32, which is rotated.

The cup 50 surrounds the substrate holding mechanism 30 and the heating unit 80. The cup 50 has a circular top opening 50A at a central top end portion thereof, and the top opening 50A has a diameter slightly larger than that of the wafer W. As shown in FIG. 4, the exhaust port 52, schematically shown in FIG. 2 as well, is formed on a bottom portion of the cup 50. Although the single exhaust port 52 is formed in the present exemplary embodiment, two or more exhaust ports may be formed.

The cup 50 and the heating unit 80 together as a single body can be lowered to a lowered position from a raised position as depicted in FIG. 3 and FIG. 4 by a non-illustrated elevating mechanism. When the cup 50 and the heating unit 80 are placed at the lowered position, a top surface of the holding unit 31 of the substrate holding mechanism 30 is located above the top end portion of the cup 50. Thus, the wafer W can be delivered between the holding unit 31 and the substrate transfer device 17 (see FIG. 1) that has advanced into the chamber 20 (see FIG. 2). Meanwhile, while the wafer W is processed, the cup 50 and the heating unit 80 are located at the raised position.

The cup 50 has a ring-shaped first exhaust space 530 in contact with the top opening thereof; and a ring-shaped second exhaust space 540 adjacent to the first exhaust space 530. At a preset position in the radial direction where the second exhaust space 540 is formed, the exhaust port 52 is provided, as shown in FIG. 4. At other positions in the circumferential direction except the preset position, the exhaust port 52 is not provided.

Except for where the exhaust port 52 is provided, cross sectional shapes of the first exhaust space 530 and the second exhaust space 540 at any positions in the circumferential direction are the same as depicted in FIG. 3. However, other components (a nozzle for cleaning the cup and a pipeline concomitant with the nozzle, a supporting member, etc.) may be provided within the first exhaust space 530 and the second exhaust space 540. At positions where such other components are provided, the cross sectional shapes of the first and second exhaust spaces 530 and 540 may be slightly different from those at the other positions. In the vicinity of the exhaust port 52, the cross sectional shape of the second exhaust space 540 is modified as the exhaust port 52 is connected thereto.

The first exhaust space 530 and the second exhaust space 540 are separated from each other by a ring-shaped guide wall 550 and a ring-shaped isolation wall 560. In the exemplary embodiment shown in FIG. 3 and FIG. 4, a lower end of the guide wall 550 and an upper end of the isolation wall 560 are connected, so that a single-body partition wall is formed. The isolation wall 560 is provided with a multiple number of communication paths 562 that are arranged intermittently along the circumferential direction with a gap therebetween. A gas can be flown from the first exhaust space 530 into the second exhaust space 540 through the communication paths 562.

The position of the lower end of the guide wall 550 (the upper end of the isolation wall 560) may be lowered to below the shown example, and the guide wall 550 may be provided with the communication paths 562.

A ring-shaped liquid reservoir 532 having a U-shaped cross section is formed at a bottom portion of the first exhaust space 530. As schematically illustrated in FIG. 3, at a certain position in the circumferential direction where the liquid reservoir 532 is provided, there is provided the drain port 51 which is schematically shown in FIG. 2 as well. A bottom surface of the liquid reservoir 532 is inclined to become lowered toward the position where the drain port 51 is provided, so that the processing liquid falling down into the liquid reservoir 532 is introduced into the drain port 51.

The cup 50 has guide surfaces 501 and 551 in contact with the first exhaust space 530. The guide surface 501 is formed by a part of an outer wall of the cup 50 and is downwardly inclined to become lower as it goes outwards in the radial direction. The guide surface 501 receives the processing liquid dispersed from the wafer W being rotated and guides the received processing liquid into the liquid reservoir 532. The guide surface 551 is formed by a top surface of the guide wall 550 and guides the dispersed processing liquid falling thereon into the liquid reservoir 532.

The isolation wall 560 serves as a bank configured to suppress the processing liquid falling into the liquid reservoir 532 from being introduced into the second exhaust space 540 before drained through the drain port 51.

The second exhaust space 540 is surrounded by the aforementioned guide wall 550, the isolation wall 560, the bottom wall 570 and a ring-shaped inner wall 580. That is, an upper end portion of the second exhaust space 540 is confined by the guide wall 550; an outer periphery portion of the second exhaust space 540 is confined by the isolation wall 560; a lower end portion of the second exhaust space 540 is confined by the bottom wall 570; and an inner periphery portion of the second exhaust space 540 is confined by the inner wall 580.

The aforementioned second nozzle 42 is supported at a support 564, which is protruded from the isolation wall 560 inwardly in the radial direction, within the second exhaust space 540. A tip end discharge opening of the second nozzle 42 is positioned above the guide surface 551 through a hole formed through the guide wall 550.

The inner wall 580 is provided with a first wall portion 581 extended in a vertical direction to serve as an upper part of the inner wall 580; and a second wall portion 582 extended in the vertical direction to serve as a lower part of the inner wall 580. The inner wall 580 is also provided with an inclined wall portion 583 extended in an inclined direction and a horizontal wall portion 584 extended in a horizontal direction, between the first wall portion 581 and the second wall portion 582. That is, the inner wall 580 is provided with the inclined wall portion 583 as a middle wall portion, which is formed such that the position of its surface from the rotation center approaches the second wall portion 582 from the first wall portion 581 as it goes downwards. The middle wall portion, however, may not be limited to being planar like the inclined wall portion 583 illustrated in FIG. 3 and FIG. 4. The middle wall portion may be curved to be protruded or recessed toward the second exhaust space 540.

The first wall portion 581 has an outer surface corresponding to a cylindrical surface of a radius R1, and the second wall portion 582 has an outer surface corresponding to a cylindrical surface of a radius R2 smaller than R1. The first wall portion 581 is located at a position adjacent to an outer periphery of the heating unit 80. The second wall portion 582 is positioned under the heating unit 80. That is, the second exhaust space 540 is protruded to be extended to a region under the heating unit 80. In the radial direction, the second wall portion 582 is adjacent to the support 86 supporting the heating unit 80 and, also, adjacent to the flange 34 of the motor (driving unit) 33. In the present exemplary embodiment, although the heating unit 80 is provided inside the first wall portion 581, the exemplary embodiment is not limited thereto, and a nozzle for processing the rear surface of the wafer W and/or a pipeline therefor may be provided instead. Furthermore, without being limited to the aforementioned rear surface processing unit, a member that constitutes the holding unit, for example, an evacuation pipe for vacuuming or the like may be provided at the inside of the first wall portion 581.

As depicted in FIG. 4, a lower portion of the second exhaust space 540 is enlarged at a region where the exhaust port 52 is formed. Accordingly, an exhaust pipe 52A having a larger diameter can be connected to the exhaust port 52. In the exemplary embodiment shown in FIG. 4, the second exhaust space 540 is extended up to an outer position than the liquid reservoir 532 in the radial direction. Furthermore, in FIG. 4, the diameter of the exhaust port 52 may be enlarged, and an inner-side end (right end in the figure) of the exhaust port 52 may be located at an inner position in the radial direction. That is, in FIG. 4, although the position of the inner-side end of the exhaust port 52 is almost same as the position of the first wall portion 581, the inner-side end of the exhaust port 52 may be located at an intermediate position between the first wall portion 581 and the second wall portion 582.

Now, a flow of fluid within the cup 50 while the wafer W is rotated will be explained. Although arrows indicating the flow of the fluid are only presented in FIG. 4, the same flow of the fluid is created in FIG. 3.

If the inside of the second exhaust space 540 is suctioned through the exhaust port 52, a pressure gradient which tends to decrease as it approaches the exhaust port 52 is formed in the internal space (i.e., in the first exhaust space 530 and the second exhaust space 540) of the cup 50. According to this pressure gradient, a gas within the cup 50 can be flown toward the exhaust port 52.

First, a gas (here, clean air discharged from the FFU 21) present above the wafer W is introduced into the first exhaust space 530 through a gap between an outer periphery of the wafer W and an inner periphery of the outer wall 502 confining the top opening 50A of the cup 50 (as indicated by an arrow G1 of FIG. 4). The gas introduced into the first exhaust space 530 is then introduced into the second exhaust space 540 through the communication paths 562.

At this time, if a processing liquid is supplied onto a front surface and/or a rear surface of the wafer W from the nozzle 41 and/or the nozzle 42, the processing liquid is dispersed from the wafer W due to a centrifugal force. Then, the dispersed processing liquid is guided by the guide surfaces 501 and 551 to fall down into the liquid reservoir 532. Fine liquid droplets are formed from a part of the processing liquid when it collides with the front or rear surface of the wafer W or when it collides with the guide surfaces 501 and 551, and are flown along the gas flow G1. A large amount of the fine liquid droplets flown along the gas flow G1 may be separated from a gas flow G2 because the direction of the gas flow G2 is sharply turned when the gas flow G2 enters the communication paths, so that the large amount of the fine liquid droplets fall down into the liquid reservoir 532. The fine liquid droplets that have not separated are discharged from the exhaust port 52 along with the gas.

The gas introduced into the second exhaust space 540 flows toward the exhaust port 52. At this time, the gas introduced in the second exhaust space 540 in the vicinity of the exhaust port 52 shown in FIG. 4 is exhausted through the exhaust port 52 as it is. Meanwhile, the gas introduced in the second exhaust space 540 apart from the exhaust port 52 is flown within the second exhaust space 540 in the circumferential direction, and then, introduced into the exhaust port 52.

Except for a region where a flow path is intentionally narrowed in order to increase a flow velocity, it is desirable to maintain a resistance against the gas flow within the cup as low as possible. Here, the region where the flow path is intentionally narrowed to increase the flow velocity may refer to, by way of non-limiting example, a gas flow passage as indicated by the arrow G1 of the first exhaust space 530 as shown in FIG. 4. For example, if a gas velocity in the vicinity of the outer periphery of the wafer W is low, fine liquid droplets of the processing liquid dispersed from the wafer W may adhere to the wafer W again, so that the wafer W may be contaminated.

Meanwhile, unlike the gas flow G1, the gas that flows within the second exhaust space 540 in the circumferential direction has not the function that suppresses the contamination of the wafer W at all. Thus, it is desirable to decrease the resistance against the gas flow within the second exhaust space 540 in the circumferential direction.

In consideration of the above, according to the exemplary embodiment, a cross sectional area of the second exhaust space 540 is enlarged by placing the second wall portion 582, which forms the lower part of the inner wall 580 configured to confine the second exhaust space 540 of the cup 50, at an inner position than the first wall portion 581 in the radial direction. Furthermore, in the present exemplary embodiment, by providing the inclined wall portion 583 between the first wall portion 581 and the second wall portion 582, the cross sectional area of the second exhaust space 540 becomes more enlarged, as compared to a case where the inclined wall portion 583 is not provided (that is, the cross sectional area of the second exhaust space is enlarged as much as the size of a triangular region 585 surrounded by a dashed dotted line in FIG. 3). As a result, the resistance against the gas flow within the second exhaust space 540 in the circumferential direction would be reduced, so that a tolerance range of a negative pressure applied to the exhaust port 52 is increased (that is, a lower limit of the absolute value of the negative pressure is lowered). Thus, even when the suction force from the exhaust port is weak and the absolute value of the negative pressure is relatively low, there may scarcely occur a problem in the gas flow within the cup 50. Furthermore, the substrate processing system 1 can be provided even in a semiconductor manufacturing factory equipped with an exhaust system having a low exhaust capacity.

Figure 5:
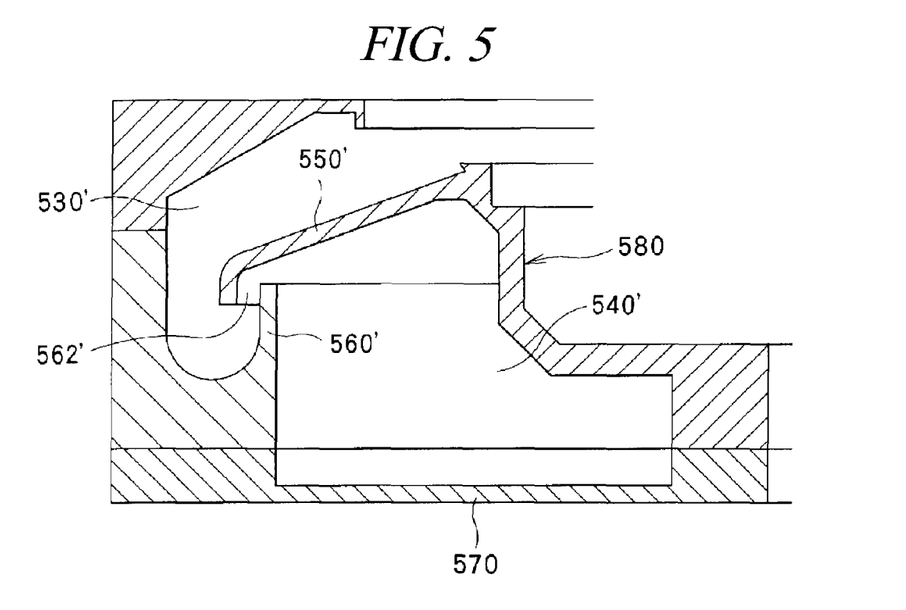
FIG. 5 is a cross sectional view for describing a modification example of a recovery cup, which is taken in the same manner as FIG. 3.

Further, according to the exemplary embodiment, the single-body partition wall is formed by connecting the lower end of the guide wall 550 and the upper end of the isolation wall 560, and the first exhaust space 530 and the second exhaust space 540 are separated by the partition wall. Moreover, the communication paths 562 through which the first exhaust space 530 and the second exhaust space 540 are allowed to communicate with each other is formed by removing a part of the upper end of the isolation wall 560. With this configuration, the cross sectional area of the second exhaust space 540 can be further enlarged. By way of example, as depicted in FIG. 5, by locating a lower end of a guide wall 550' at an outer position than an isolation wall 560' in the radial direction and, also, by locating the lower end of the guide wall 550' under the upper end of the isolation wall 560', a gap (which is extended along the entire circumferential direction) between the lower end of the guide wall 550' and the upper end of the isolation wall 560' is formed as the communication path 562' that allows the first exhaust space 530' and the second exhaust space 540' to communicate with each other (this configuration corresponds to that disclosed in Patent Document 1 as the prior art). With this configuration, however, the cross sectional area of the second exhaust space 540' is reduced as much as the isolation wall 560' is moved inwardly in the radial direction. Therefore, in order to increase the cross sectional area of the second exhaust space 540, it may be desirable that the guide wall 550 and the isolation wall 560 are configured as depicted in FIG. 3 and FIG. 4. The configuration shown in FIG. 5, however, is also adoptable.

Figure 6:
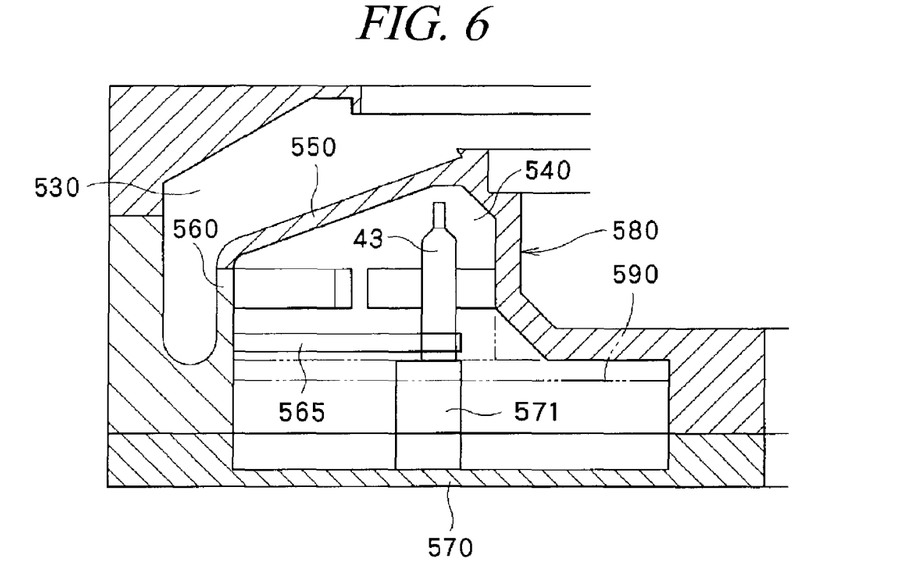
FIG. 6 is a cross sectional view for describing another modification example of the recovery cup, which is taken in the same manner as FIG. 3.

Within the second exhaust space 540, besides the second nozzle 42, a nozzle 43 (and a pipeline for supplying a liquid thereto, etc.) for discharging a cleaning liquid, such as pure water, toward a wall surface in contact with the second exhaust space 540, for example, may also be provided to remove the processing liquid or a solid material originated from the processing liquid which adheres to the wall surface (see FIG. 6). When providing such a nozzle, it may be desirable to allow a support for fixing the nozzle to the cup 50 to occupy as small a volume as possible within the second exhaust space 540. When providing such a support, it may be desirable to provide a cantilever support 565 inwardly protruded from the isolation wall 560 in the radial direction, or a support 571 upwardly extended from the bottom wall 570, as illustrated in FIG. 6. By way of example, it is not desirable to provide a support 590 (indicated by a dashed dotted line in FIG. 6) which is horizontally extended between the isolation wall 560 and the inner wall 580. Especially, it should be avoided to adopt a configuration where the support 590 is extended in the circumferential direction.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate liquid processing apparatus, comprising:
a holding unit configured to hold a substrate horizontally;
a driving unit configured to rotate the holding unit around a vertical axis;
a nozzle configured to supply a processing liquid onto the substrate which is rotated while being held by the holding unit; and
a cup configured to receive the processing liquid supplied onto the substrate,
wherein the cup comprises a top opening at a central top end portion thereof and an exhaust port through which an inside of the cup is exhausted,
the cup further comprises a ring-shaped first exhaust space in contact with the top opening, and a ring-shaped second exhaust space which is in contact with the exhaust port and is disposed adjacent to the first exhaust space,
the ring-shaped first exhaust space and the ring-shaped second exhaust space communicate with each other intermittently or continuously along an entire circumference thereof,
the ring-shaped first exhaust space has a ring-shaped liquid reservoir configured to receive the processing liquid supplied onto the substrate,
a ring-shaped guide wall, which is configured to separate the ring-shaped first exhaust space from the ring-shaped second exhaust space and guide the processing liquid supplied onto the substrate toward the liquid reservoir, is provided,
a ring-shaped isolation wall, which is configured to separate the ring-shaped first exhaust space from the ring-shaped second exhaust space and suppress the processing liquid received in the liquid reservoir from being introduced into the ring-shaped second exhaust space, is provided, the cup further comprises an inner wall configured to confine an inner periphery portion of the ring-shaped second exhaust space, and the inner wall comprises a first wall portion serving as an upper part of the inner wall, and a second wall portion which serves as a lower part of the inner wall and is located at an inner position than the first wall portion in a radial direction, and the inner wall is located at an inner position than the ring-shaped isolation wall in the radial direction.

2. The substrate liquid processing apparatus of claim 1, wherein the inner wall further comprises a middle wall portion which is provided between the first wall portion and the second wall portion such that a position of a front surface of the middle wall portion becomes closer to the second wall portion from the first wall portion as it goes downwards.

3. The substrate liquid processing apparatus of claim 2, wherein the middle wall portion is an inclined portion having an inclined surface.

4. The substrate liquid processing apparatus of claim 1, wherein an outer periphery of the ring-shaped second exhaust space at a region where the exhaust port is provided is located at an outer position than the outer periphery of the ring-shaped second exhaust space at a region where the exhaust port is not provided.

5. The substrate liquid processing apparatus of claim 1, wherein an inner-side end of the exhaust port is located at an inner position than the first wall portion in the radial direction.

6. The substrate liquid processing apparatus of claim 1, further comprising:

a rear surface processing unit, surrounding the holding unit, configured to process a rear surface of the substrate and placed under the substrate held by the holding unit, wherein the first wall portion is located at an outer position of the rear surface processing unit in the radial direction, and the second wall portion is positioned under the rear surface processing unit.

7. The substrate liquid processing apparatus of claim 6, wherein the rear surface processing unit is a heating unit configured to heat the rear surface of the substrate.

8. The substrate liquid processing apparatus of claim 1, wherein a member constituting the holding unit is provided up to a height position of the inner wall, and the first wall portion is located at an outer position of the member constituting the holding unit in the radial direction, and the second wall portion is positioned under the member constituting the holding unit.

9. The substrate liquid processing apparatus of claim 1, wherein the first wall portion and the second wall portion of the inner wall are extended in a vertical direction.

10. The substrate liquid processing apparatus of claim 1, wherein a lower end of the ring-shaped guide wall and an upper end of the ring-shaped isolation wall are connected, and the ring-shaped isolation wall or the ring-shaped guide wall is provided with a plurality of communication paths, through which the ring-shaped first exhaust space and the ring-shaped second exhaust space communicate with each other, intermittently along the entire circumference thereof.

11. The substrate liquid processing apparatus of claim 1, wherein an upper end portion of the ring-shaped second exhaust space is confined by the ring-shaped guide wall, an outer periphery portion of the ring-shaped second exhaust space is confined by the ring-shaped isolation wall, a lower end portion of the ring-shaped second exhaust space is confined by a bottom wall of the cup, and the inner periphery portion of the ring-shaped second exhaust space is confined by the inner wall.

* * * * *